United States Patent [19]

Tamura

[11] Patent Number: 4,668,921

[45] Date of Patent: May 26, 1987

[54] POWER SUPPLY CIRCUIT

[75] Inventor: Eijiro Tamura, Tokyo, Japan

[73] Assignee: Trio Kabushiki Kaisha, Japan

[21] Appl. No.: 663,180

[22] Filed: Oct. 22, 1984

[30] Foreign Application Priority Data

Oct. 24, 1983 [JP]  Japan .................................. 58-197700

[51] Int. Cl.$^4$ .............................................. H03F 3/30
[52] U.S. Cl. .................................... 330/297; 323/364;
330/267; 363/45
[58] Field of Search ............... 330/199, 123, 202, 267,
330/273, 297; 363/44, 45, 89, 97, 98, 132;
323/364, 365, 370; 333/181

[56] References Cited

U.S. PATENT DOCUMENTS 4,445,095  4/1984  Carver ................................ 330/297

Primary Examiner—James B. Mullins
Attorney, Agent, or Firm—Gerald J. Ferguson, Jr.;
Michael P. Hoffman; Ronni S. Malamud

[57] ABSTRACT

A power supply circuit having rectifiers and selectable first to n-th power supply voltage terminals for supplying various levels of output voltages. Between respective terminals and an earth, first smoothing capacitors (e.g. $C_1$–$C_4$) are connected. Between i-th terminal and (i−1)-th terminal (wherein, $2 \leq i \leq n$), second smoothing capacitors (e.g. $C_5$, $C_6$, $C_n$, $C_{n-1}$) are connected. When i-th terminal is selected, not only capacitance of the first smoothing capacitor connected between the i-th terminal and the earth, but also capacitance of the first capacitor connected between the (i−1)-th terminal and the earth and the second capacitor connected between the i-th and (i−1)-th terminals are utilized for smoothing operation.

2 Claims, 8 Drawing Figures

PRIOR ART FIG. 1
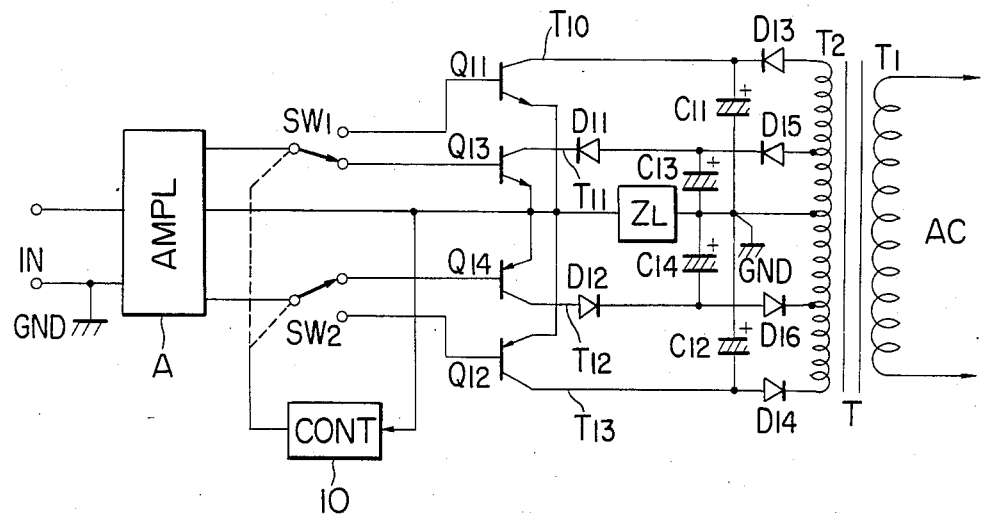
FIG. 2
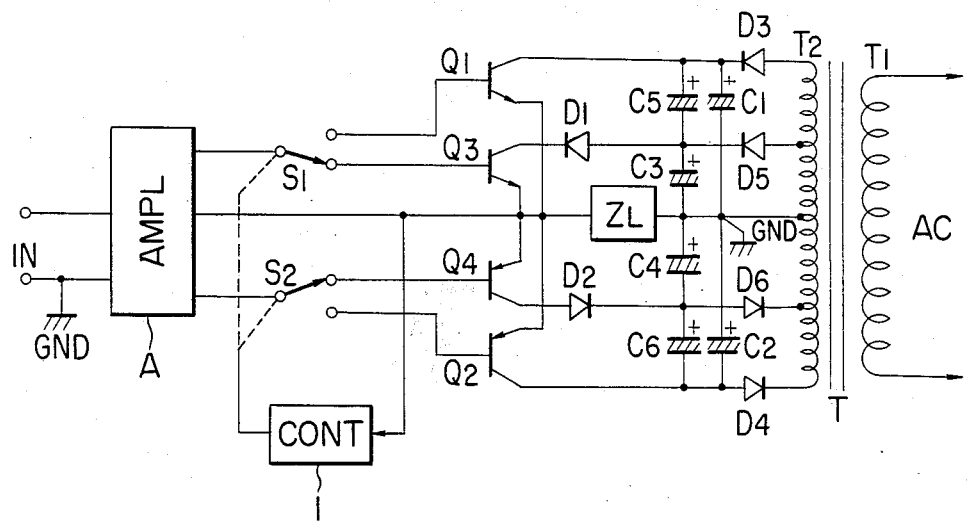

FIG. 6
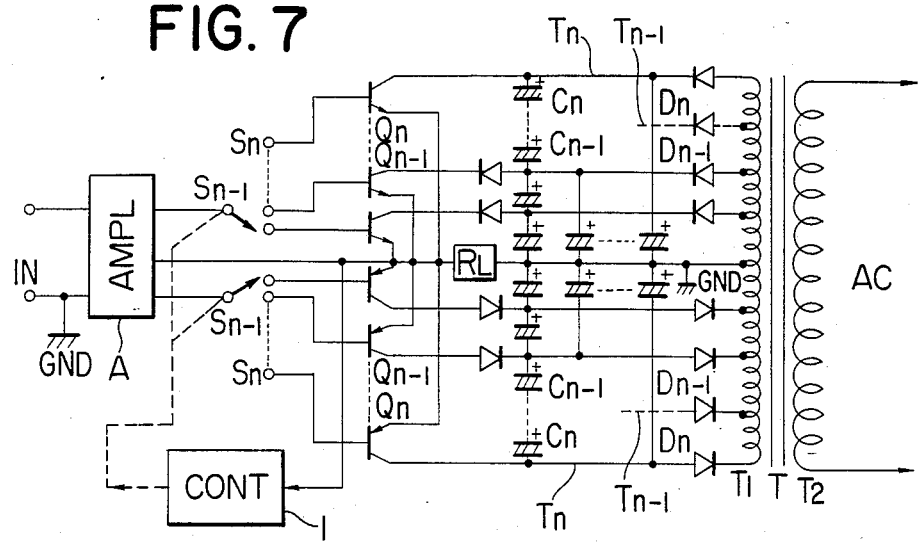
FIG. 7
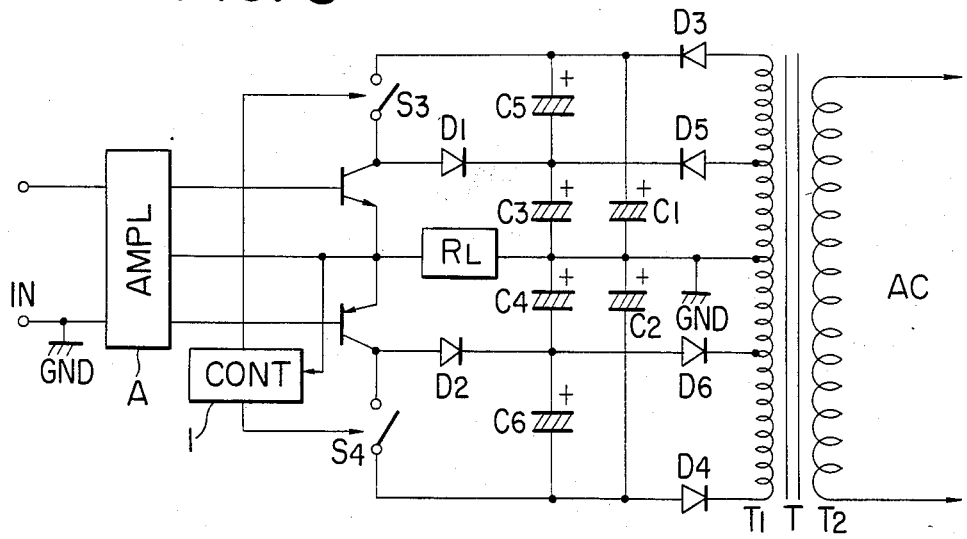
FIG. 8

POWER SUPPLY CIRCUIT

BACKGROUND OF THE INVENTION

1. Field of the Invention

The present invention relates to a power supply circuit and, more particularly, to a power supply circuit of the voltage change-over type for use in an audio amplifier.

2. Description of the Prior Art

Recently, there has been provided a method of improving a sound quality by enlarging the dynamic range by increasing the dynamic power of an audio amplifier. Such a high-power audio amplifier uses a power supply of the high-capacity and low-impedance type corresponding to its dynamic power. However, such a high-capacity type power supply is an excessive equipment and is wasted when it is used at an ordinary listening level (output on the order of about hundreds of milliwatts), and at the same time it is used in turn at an output level which is remarkably lower than the rated output, so that there are disadvantages such that an electric power is lost and abnormal exothermic is caused and the like.

To solve such a drawback, conventionally, the efficiency is improved by use of a power supply of the voltage change-over type for an output transformerless type amplifier as shown in FIG. 1. A schematic arrangement of this power supply will be explained below. A reference numeral 10 denotes a control circuit to detect a voltage (output voltage) across a load ZL; $T_{10}$ and $T_{13}$ are high voltage taps; $T_{11}$ and $T_{12}$ low voltage taps; and $SW_1$ and $SW_2$ are switches which are respectively provided at the front stages of transistors $Q_{11}$ and $Q_{13}$ and of transistors $Q_{12}$ and $Q_{14}$. The transistors $Q_{11}$ and $Q_{12}$ are complementary. And also, the transistors $Q_{13}$ and $Q_{14}$ are complementary. The voltage across the load ZL is detected by the control circuit 10 and, in response to this detection signal, the two taps of the high voltage taps ($T_{10}$, $T_{13}$) and low voltage taps ($T_{11}$, $T_{12}$) that are outputted through diodes $D_{11}$ to $D_{16}$ from a secondary winding $T_2$ of a transformer T ($T_1$ indicates a primary input winding of an alternate current supply source AC) are switched by the switches $SW_1$ and $SW_2$ and used. With such an arrangement, the electric power is supplied to the load ZL through the transistors $Q_{13}$ and $Q_{14}$ when the outputs of an amplifier A are small, but in this case the voltage between the collector and emitter of the transistors $Q_{13}$ and $Q_{14}$ becomes low, thereby enabling the electric power loss to be reduced. On the other hand, when the outputs of the amplifier A are large, the electric power is supplied to the load ZL through the transistors $Q_{11}$ and $Q_{12}$, but the electric power loss itself does not increase since the amplitude of the outputs are large. Thus, the operations as described above can be performed.

However, as mentioned above, the listening level which is ordinarily used in a standard home is generally on the order of about hundreds of milliwatts on an average (for example, since the power supply change-over point is set to about 30 W/8 Ω in an amplifier having the maximum dynamic power of 100 W/8 Ω, the power supply on the low voltage side is used in case of the output of 0 to 30 W). Therefore, only the circuit on the low voltage side is always made operative in the ordinary use state, while the circuit on the high voltage side is at rest. Thus, only capacitors $C_{13}$ and $C_{14}$ which are used in the power supply on the low voltage side are always used, but capacitors $C_{11}$ and $C_{12}$ which are used in the power supply on the high voltage side are hardly utilized. In addition, even in the case where the power supply on the high voltage side is used due to an instantaneous high output, the capacitors $C_{13}$ and $C_{14}$ for use in the power supply on the low voltage side are at rest, so that the capacitors cannot be effectively used in the power supply of the conventional type mentioned above. The individual power supplies need the capacitors each having a considerable capacitance and this results in a cause of an increase in costs.

SUMMARY OF THE INVENTION

The present invention is made in consideration of such points, intending to provide a power supply circuit in which a smoothing capacitor for use in a power supply is effectively used, thereby enabling the capacities of individual capacitors to be reduced while maintaining the same smoothing capacity, so that the cost can be reduced.

To accomplish the above object, a power supply circuit according to the present invention can change over the output voltage among at least two or more stages by switching the first to n-th power supply voltage terminals from which the power is outputted through rectifiers, whereby a smoothing capacitor is connected between the i-th tap and the (i−1)-th tap (where, $n \geq i \geq 2$).

BRIEF DESCRIPTION OF THE DRAWINGS

FIG. 1 is a circuit diagram showing a conventional power supply circuit;

FIG. 2 is a diagram showing an embodiment of a power supply circuit according to the present invention;

FIGS. 3 to 6 are diagrams for explaining the principle of the operation; and

FIGS. 7 and 8 are circuit diagrams showing other embodiments of the invention.

DESCRIPTION OF THE PREFERRED EMBODIMENTS

Embodiments of a power supply circuit according to the present invention will be described with reference to FIGS. 2 to 8.

Figure 3:
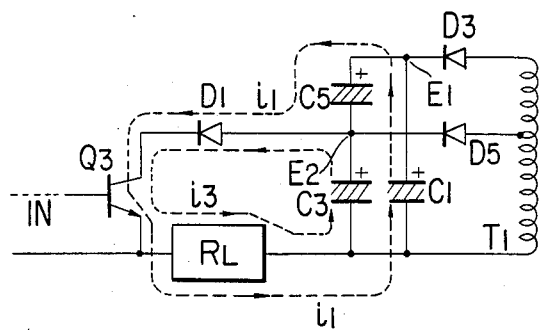
Figure 4:
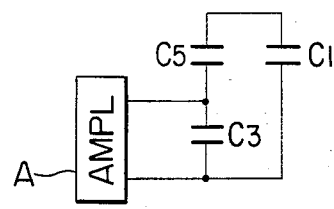
Figure 5:
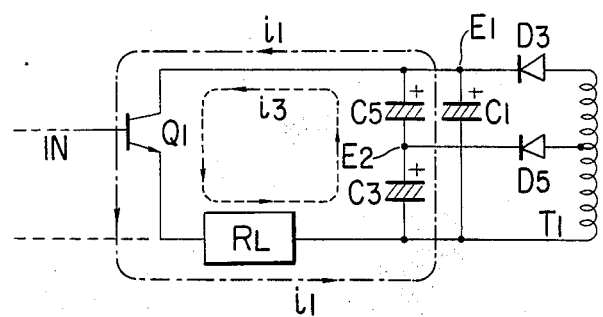

FIG. 2 is a fundamental circuit diagram, FIGS. 3 to 6 are diagrams for explaining the principle of the operation, and FIGS. 7 and 8 are circuit diagrams showing other embodiments. In the diagrams, a reference numeral 1 denotes a control circuit; A is the amplifier; $Q_1$ to $Q_4$ transistors; $D_1$ to $D_6$ diodes serving as rectifiers; T the transformer; $S_1$ and $S_2$ switches to change over the high voltage power supply and low voltage power supply and use it. These components are similar to the conventional arrangement and the power supply of the ± two power supply type is constituted. $C_1$ indicates a capacitor connected between a high voltage power supply on the positive (+) side and an earth GND; $C_2$ is a capacitor connected between a high voltage power supply on the negative (−) side and the earth GND; $C_3$ is a capacitor connected between a low voltage power supply on the (+) side and the earth GND; and $C_4$ is a capacitor connected between the low voltage power supply on the (−) side and the earth GND, respectively. $C_5$ denotes a smoothing capacitor connected between an n-th order output tap, i.e., a high voltage side output tap on the (+) side and an (n−1)-th order output tap, i.e., a low voltage side output tap on the (+) side; and $C_6$ represents a smoothing capacitor connected likewise between a high voltage side output tap on the (−) side and a low voltage side output tap on the (−) side, respectively. In the above-mentioned arrangement, the case where the output stage operates at the B class and where the half cycle on the positive side is amplified will now be explained. First, in the low output operational mode, the control circuit 1 sets the switch $S_1$ onto the side of the transistor $Q_3$, so that the transistor $Q_1$ is turned off. Therefore, in this case, the circuit can be considered as an equivalent circuit shown in FIG. 3. In this equivalent circuit, when no signal is inputted, the capacitors $C_1$, $C_3$ and $C_5$ have been completely charged, so that a voltage $E_1$ is applied to the capacitor $C_1$, a voltage $E_2$ is applied to the capacitor $C_3$ and a voltage $(E_1-E_2)$ is applied to the capacitor $C_5$. When a signal (IN) is inputted and the transistor $Q_3$ is turned on in this state, a current $i_3$ is supplied from the capacitor $C_3$ to a load RL through the diode $D_1$ and transistor $Q_3$. At the same time, a current $i_1$ is supplied from the capacitor $C_1$ to the load RL through the capacitor $C_5 \rightarrow$ diode $D_1 \rightarrow$ transistor $Q_3$. Namely, the capacitor $C_5$ functions as a bypass circuit for the current $i_1$. When this state is discussed from the side of the amplifier A, it can be considered as an equivalent circuit as shown in FIG. 4. Namely, an impedance $Z_1$ of the power supply becomes $$Z_1(jw) = \frac{1}{jw} \cdot \frac{C_1 + C_5}{C_1 \cdot C_5 + C_3(C_1 + C_5)}$$

Now, assuming that $C_1=C_3=C_5$ (the capacitances are the same), we will have $$Z_1(jw) = \frac{1}{jw} \cdot \frac{1}{3/2C_3}$$

Thus, this circuit is equivalent to the circuit in which the capacitance of the capacitor $C_{13}$ already explained in FIG. 1 was increased by 1.5 times. Therefore, the impedance of the power supply from the side of the amplifier A becomes $\frac{2}{3}$, so that this makes it possible to reduce the impedance by 33% as compared with the conventional one. Due to this, the AC variation component of the collector voltage of the transistor $Q_3$ decreases and the stable power can be supplied. Consequently, this makes it possible to allow the amplifier A to amplify the waveform with high fidelity and thereby to improve the sound quality.

Next, the operation in the high output mode will be explained. In this case, since the control circuit 1 sets the switch $S_1$ onto the side of the transistor $Q_1$ and the transistor $Q_3$ is turned off, so that the circuit can be considered as an equivalent circuit shown in FIG. 5. In the circuit shown in FIG. 5, when a signal is inputted and the transistor $Q_1$ is turned on, the current $i_3$ is supplied to the load RL due to the series circuit of the capacitors $C_3$ and $C_5$, while the current $i_1$ is supplied from the capacitor $C_1$ to the load RL through the transistor $Q_1$. When this state is discussed from the side of the amplifier A, it can be considered as an equivalent circuit as shown in FIG. 6. At this time, an impedance $Z_2$ of the power supply becomes $$Z_2(jw) = \frac{1}{jw} \cdot \frac{C_3 + C_5}{C_3 \cdot C_5 + C_1(C_3 + C_5)}$$

Now, assuming that $C_1=C_3=C_5$ (the capacitances are the same), we will have $$Z_1(jw) = \frac{1}{jw} \cdot \frac{1}{3/2C_1}$$

Namely, this circuit is equivalent to the circuit in which the capacitor $C_{11}$ already described in FIG. 1 was increased by 1.5 times. Due to this, the impedance of the power supply from the side of the amplifier A becomes $\frac{2}{3}$, thereby enabling the impedance to be likewise reduced by 33%. Therefore, the AC variation component of the collector voltage of the transistor $Q_1$ decreases and the sound quality can be improved.

In this way, the case of the amplification of the half cycle on the positive side has been described above. Further, the half cycle amplification on the negative side will be similarly considered; therefore, the negative side half cycle amplification is omitted here.

FIG. 7 shows an example of the applied form of the invention whereby the power supply voltage can be changed over among the n stages. In this application, a smoothing capacitor $C_n$ is connected between an n-th order tap $T_n$ and an (n−1)-th order tap $T_{n-1}$ and in the similar manner as above, a capacitor $C_{n-1}$ is connected between a tap $T_{n-1}$ and a tap $T_{n-2}$ and a capacitor $C_{n-2}$ is connected between a tap $T_{n-2}$ and a tap $T_{n-3}$, respectively.

FIG. 8 shows an example of another applied form of the invention which is applied to a power supply circuit (H-class amplifier) whereby the low voltage side power supply and high voltage side power supply are changed over in accordance with the output level or input level. In this circuit, the power supply is switched by means of switches $S_3$ and $S_4$, and the capacitors $C_5$ and $C_6$ are added, thereby enabling the power supply to be stabilized as described above.

As mentioned above, the present invention intends to certainly stabilize the power supply by effectively utilizing the capacitors and thereby to improve the sound quality. Although it is necessary to increase the capacitances of capacitors $C_{11}$ to $C_{14}$ for stabilization of the power supply in the conventional technology, in case of the capacitors $C_5$ and $C_6$ added in this invention, it is enough that they have the withstanding voltages corresponding to only the voltage difference between the high voltage power supply and the low voltage power supply. In addition, the costs of them are remarkably cheap. Therefore, the power supply can be stabilized without causing an excessive increase in costs.

What I claim is:

1. A power supply circuit comprising
    a transformer having a primary winding to which a signal is applied and a secondary winding having at least n taps;
    at least n refectifiers respectively connected to said n taps for respectively supplying n different levels of output voltage at n different output voltage terminals;
    switching means for selecting one of said n different levels of output voltage as the output voltage of the power supply circuit;

n smoothing capacitors respectively connected between the first to n-th output voltage terminals and a reference voltage terminal; and n−1 further smoothing capacitors respectively connected between the i-th output voltage terminal and the (i−1)-th output voltage terminal where $2 \leq i \leq n$ where both said n smoothing capacitors and said n−1 further smoothing capacitors smooth the output voltages supplied from said n taps.

2. A power supply circuit according to claim 1, wherein said n output voltage terminals are respectively connected to n collector terminals of n/2 pairs of complementary type transistors of a transformerless output type amplifier.

* * * * *